United States Patent [19]

Bjerre

[11] Patent Number: 5,481,617
[45] Date of Patent: Jan. 2, 1996

[54] LOUDSPEAKER ARRANGEMENT WITH FREQUENCY DEPENDENT AMPLITUDE REGULATION

[75] Inventor: Egon Bjerre, Struer, Denmark

[73] Assignee: Bang & Olufsen A/S, Struer, Denmark

[21] Appl. No.: 137,138

[22] PCT Filed: Mar. 1, 1993

[86] PCT No.: PCT/EP93/00941

§ 371 Date: Dec. 7, 1993

§ 102(e) Date: Dec. 7, 1993

[87] PCT Pub. No.: WO93/18626

PCT Pub. Date: Sep. 16, 1993

[30] Foreign Application Priority Data

Mar. 2, 1992 [DK] Denmark ................... 269-92

[51] Int. Cl.[6] ................................. H04R 25/00
[52] U.S. Cl. ................ 381/108; 381/107; 381/98
[58] Field of Search ................ 381/55, 98, 103, 381/121, 107–108

[56] References Cited

U.S. PATENT DOCUMENTS

| | | | |
|---|---|---|---|
| 4,113,983 | 9/1978 | Steel | 179/1 VL |
| 4,327,250 | 4/1982 | von Recklinghausen | 179/1 F |
| 4,503,554 | 3/1985 | Davis | 381/107 |
| 4,622,692 | 11/1986 | Cole | 381/108 |
| 4,746,881 | 5/1988 | Suzuki et al. | 381/103 |
| 4,837,832 | 6/1989 | Fanshel | 381/107 |
| 4,843,626 | 6/1989 | Werrbach | 381/107 |
| 5,208,837 | 5/1993 | Richey | 381/103 |

FOREIGN PATENT DOCUMENTS

| | | |
|---|---|---|
| 0287057 | 10/1988 | European Pat. Off. . |
| 2415816 | 10/1975 | Germany . |

*Primary Examiner*—Stephen Brinich
*Attorney, Agent, or Firm*—Robert J. Kraus

[57] ABSTRACT

A known technique to improve bass reproduction in loudspeakers is by boosting amplitude at low frequencies, but this can lead to an overload at high signal level. This can be prevented if the level is detected in order to decrease the amplitude boost. To detect the level in the relevant frequency region, a band or high pass filter before the detector is normally used, but this creates a delay in regulation, so that a high signal peak can introduce audible distortion. The described arrangement prevents this, as the signal is led through a variable band pass filter (10) and directly to the detector (8), which therefore receives the full signal. The arrangement operates such that the lower cut-off frequency of the band pass filter changes so that the lowest frequency range gets the highest attenuation. From the band pass filter (10) the signal is led also to a high pass filter (16) with constant bass boost and after this to differential stage (18), where the signal is amplified corresponding to the attenuation in the band pass filter (10). The signal restored by this means will be free of overload sequences because filter delay before the detector (8) is prevented and therefore permits instantaneous regulation of the band pass filter (10) to attenuate low frequencies.

6 Claims, 1 Drawing Sheet

LOUDSPEAKER ARRANGEMENT WITH FREQUENCY DEPENDENT AMPLITUDE REGULATION

BACKGROUND OF THE INVENTION

The present invention relates to a loudspeaker arrangement comprising
- a loudspeaker
- an input for receiving a signal
- means for boosting the amplitude of the signal received
- an amplitude detector for detecting amplitude changings in a signal part within a predetermined frequency range
- filtering means to selectively control the amplitude boost in dependence on an output signal of the amplitude detector so as to prevent overloading at strong levels of the boosted signal.

It is a commonly used technique to improve the bass reproduction in ordinary loudspeakers by providing extra amplification for the low frequencies of the signal supplied to the loudspeaker. The frequency characteristics of the loudspeakers drop within the bass frequency range. Through appropriate amplitude increase within this range, the loudspeaker diaphragm is forced to work with increased "pumping effect" within the range. This will straighten out some of the frequency characteristics. Even a comparatively small loudspeaker may then achieve a surprisingly good bass reproduction.

However, this technique has its limits, i.e., the loudspeaker ability to react correctly to rather strong intermediate signals, as the diaphragm has a limited operation stroke. If this is used to its maximum at a certain signal strength, overload will be the result if the signal becomes even stronger in periods. The same may apply to the matching amplifier and to the amplifier in question, which has been ideally adapted to the loudspeaker. It will have no purpose to let the amplifier handle signals, which the loudspeaker cannot reproduce anyway. It should therefore be accepted that such a loudspeaker system can only be operated to a certain limit, if a reasonably correct reproduction is required also of the strong signal passages.

However, it is already known that this may be subdued by detecting the signal level and adjusting the amplitude to gradually damp the increase as the signal becomes stronger. This may give a normally acceptable reproduction of too strong signals within a noticeable frequency range in falling continuation of the range in which the loudspeaker can reproduce correctly, as the signals in question will only be compressed progressively with the volume. In general a certain loudspeaker can work with increased volume without considerable overload in case of extra strong passages, as these will only be relatively attenuated.

The loudspeaker should be able to work with signal frequencies also above the range in which it is of current interest to carry out the amplitude increase mentioned. In this upper range, however, the loudspeaker can reproduce even the strong passages, which should not be attenuated by the influence of the amplitude detector. U.S. Pat. No. 4,327,250 discloses a solution for this problem. This is done by inserting a band pass or low pass filter in front of the detector unit, so that this does not react to strong amplitudes within the "undangerous" frequency range.

This is a simple solution, but with noticeable problems. When using the filter in question a certain time distortion of the signal arises, which delays the amplitude detection and its effect. The amplifier/loudspeaker unit may thus be overloaded for a short period before the detector reduces the signal level, which may be very audible. On the other hand the detector circuit may receive delayed information that a reduction has taken place within the level in question, which may result in a reduction to a level lower than wanted. In order to prevent this the adjustment speed can be reduced. However, this means that the risk of overload at the beginning of a strong passage increases due to the slowness within the adjustment system.

SUMMARY OF THE INVENTION

It is an object of the invention to provide for loudspeaker arrangement according to the opening paragraph, and which is known from the said document U.S. Pat. No. 4,327,250, without the disadvantages mentioned above.

According to the invention this object is achieved by a loudspeaker arranged according to the opening paragraph and characterized by the filtering means comprising a band pass filter with an input coupled to the output of the arrangement and differentiating filter for amplifying the signal received from the band pass filter corresponding to the signal attenuation caused by the band pass filter, and input of the amplitude detector being coupled to the output of the band pass filter for detecting said amplitude changes, an output of the amplitude detector being coupled to a control input of the band pass filter for selectively controlling the amplitude boost.

The signal-receiving band pass filter sends its output signal directly to the amplitude detector, which will, at strong signal passages, control the band pass filter appropriately to increase the lower cut-off frequency. The signal is thereby weakened in general in proportion with the "over strength" of the applied signal. The weakened signal runs through a filter, which is made for selective amplitude increase of the low frequencies just seen, and finally for carrying the signal through a differentiating step, which amplifies the whole signal to the same degree as it was attenuated in the signal-receiving band pass filter. The signal can thus be supplied to the loudspeaker in undistorted condition and with the wanted increase of the amplitude of the low frequency parts of the signal.

It is found that the amplitude detector can react instantaneously to a sudden increase of the signal strength, like a drum beat, so that the matching reduction is completed before the signal can cause any overload.

BRIEF DESCRIPTION OF THE DRAWING

In the following description the invention is explained in details with reference to the drawing figures in which.

DESCRIPTION OF THE PREFERRED EMBODIMENTS

Figure 1:
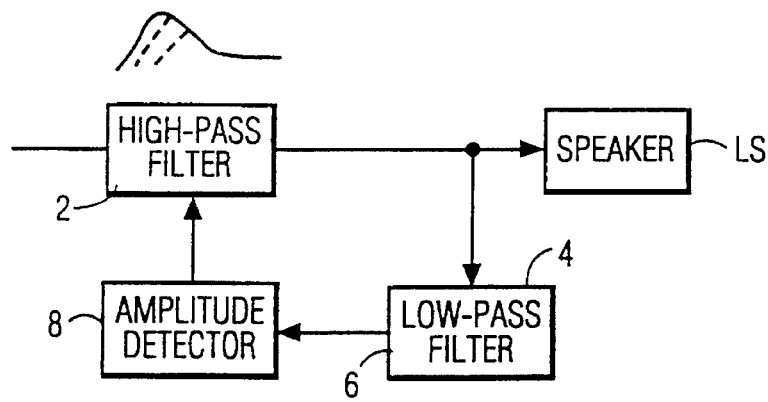
FIG. 1 is a block diagram showing a prior art loudspeaker arrangement.
Figure 2:
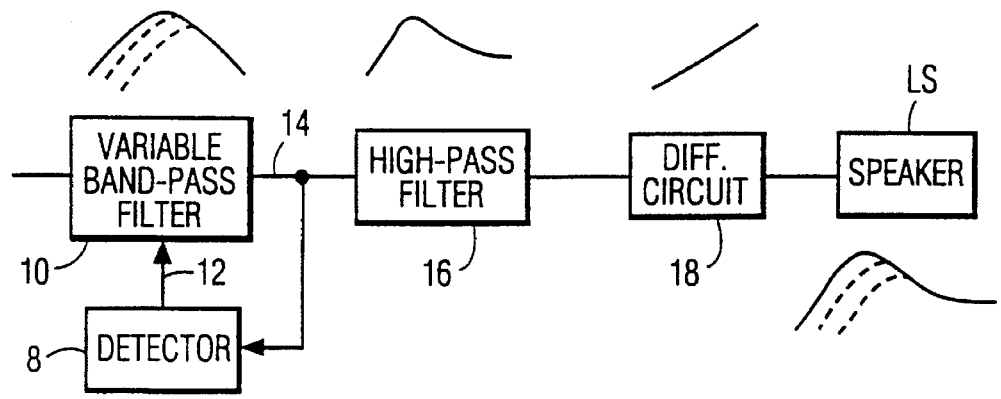
FIG. 2 is a block diagram showing an embodiment of the loudspeaker arrangement according to the invention.

In the known prior art (see FIG. 2) represented by for example US-A 4,327,250, the amplifier signal is supplied to a high pass filter 2 with adjustable increase of the detected bass frequencies.

The output signal from this filter runs directly to the connected speaker LS as well as to a low pass filter 4, which only permits those signal frequencies to pass which lie within the lower "dangerous" range. Output 6 of this filter is connected to an amplitude detector 8, which is control-connected to the high pass filter 2 so that this increases the lower cut-off frequency at a demonstrated increase in the amplitude of the detected and filtered signal.

As illustrated by the transfer function curve above unit 2 this means that the amplitude increase of the low frequencies is deteriorated, the higher these frequencies are. This ensures that the loudspeaker LS can reproduce strong signal passages without mechanical distortions. However, filter 4 causes an adjustment delay, which results in the disadvantages mentioned. In an embodiment of a loudspeaker arrangement in accordance with the invention the invention, see FIG. 2, the signal receiving filter 2 is replaced by an adjustable band pass filter 10, which supplies its output signal directly to the amplitude detector 8, which detects the signal at its full frequency band width. Through its output cable 12 this detector makes BP filter 10 adjust the lower cut-off frequency, as illustrated by the transfer function shown above the filter. Through this function the general signal, complete with partial subdual of the lower frequencies, is attenuated by e.g., 6 dB per octave.

The signal is fed from an output cable 14 from the filter 10 to a filter 16. This filter permanently causes a selective amplitude increase of the incoming low frequency signals, while the remaining filter is linear as is illustrated by the transfer function shown above the filter 16.

From the filter unit 16 the signal runs to a differentiating circuit 18, where the general signal is amplified by e.g., 6 dB per octave so that the attenuation, carried out in the first filter 10 is now equalized. At the output from circuit 18 the total transfer function is shown. This is the sum of the functions from the three units 10, 16 and 18, and it appears that this function is just what was aimed at.

Figure 3:
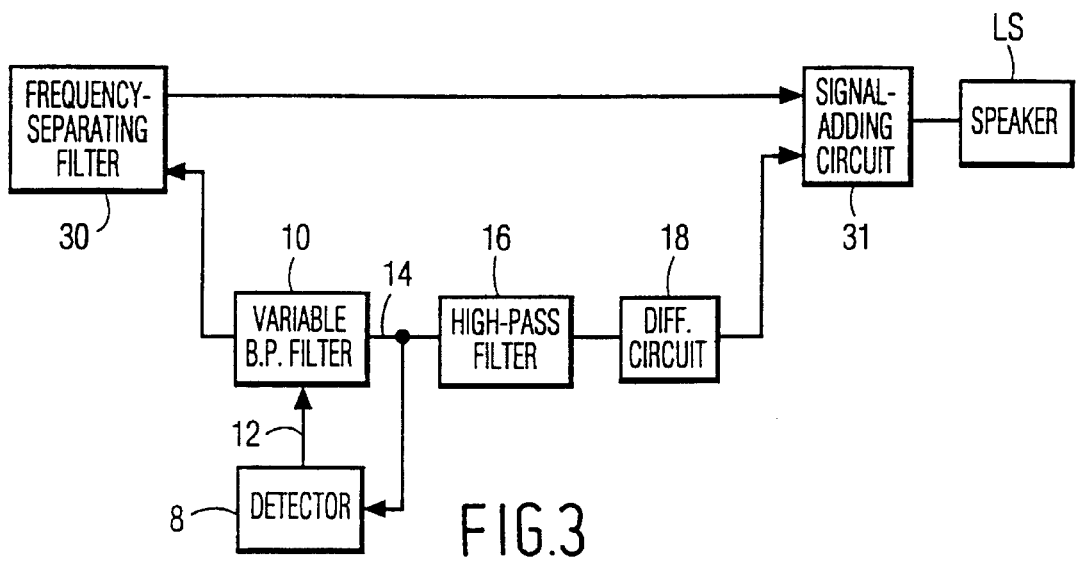
FIG. 3 is a block diagram showing another loudspeaker arrangement according to the invention.

The amplitude detector 8 reacts immediately to the amplitude changes at the output of the BP filter 10. Tests have established that this may happen already during the first half period of a suddenly increased signal. The adjustment is therefore made so quickly that no audible distortion can arise. At decreasing signal strength the adjustment circuit carries out a slower, and potentially not a corresponding sudden, re-adjustment, for example stretched across 1–2 seconds. This makes it less audible that an adjustment is made. The basis for the simple solution, namely that the total attenuation and the following reamplification of the whole signal, cannot in itself be said to be an advantage, as it does not exactly improve a good signal/noise ratio, if it is carried too tar. It is therefore to be preferred to connect the loudspeakers directly in parallel with the illustrated signal line (see FIG. 3). A filter 30 for separating the low frequencies is placed in the direct connection. The low frequency components (e.g., 20–500 Hz) of the signal are supplied to the variable band pass filter 10. The high frequency components (e.g., above 500 Hz) are supplied to a signal adding circuit 31, which adds the high frequency components to the low frequency components received from differentiating circuit 18. The output of the adding circuit is supplied to the loudspeaker LS. Please note that the filter 15 can be placed in front of the BP filter 10, and it can also be placed after the differentiating circuit 18. The important fact is that the carrier functions of the units shown are added. Especially in case of large speakers, which already have a satisfactory bass reproduction, it may not be necessary to carry out the artificial amplitude increase. In that case the filter 16 can be left out. It may still be very relevant to work with the momentarily controlled adjustment of the lower limit frequency, and the units 10.8 and 18 form the basis for a system according to the invention.

As the total adjustment system should be carefully adapted to the loudspeaker used, it will be natural that the system is built into the loudspeaker cabinet, and it will thus also be natural that this includes a power amplifier in front of the input of the loudspeaker. However, it will be understood that the invention is not limited to this, as the system can also be placed in a separate amplifier unit.

I claim:

1. In a speaker-driving circuit arrangement having a signal input for receiving a variable amplitude input signal and means eclectically coupled to said input for boosting the amplitude of said input signal for a predetermined band of frequencies, the improvement comprising:

a. a variable band-pass filter having a first input electrically coupled to the signal input, a second input and an output, said filter being adapted to pass at least the predetermined band of frequencies and to effectively decrease the magnitude of the boost, especially in a selected portion of said band, in response to a control signal indicating that an output signal of said filter will cause overloading of the speaker;

b. an amplitude detector having an input electrically coupled to the output of the band-pass filter and having an output electrically coupled to the second input of said band-pass filter, said amplitude detector being adapted to produce said control signal responsive to the amplitude of the output signal of said band-pass filter; and c. a differentiating circuit having an input electrically coupled to the output of the band-pass filter and having an output for electrical coupling to the speaker, said differentiating circuit being adapted to compensate for any decrease of signal magnitude, in at least a portion of said band lying outside of the selected portion, which is effected by the variable band-pass filter.

2. A circuit arrangement as in claim 1 where the variable band-pass filter affects the magnitude of the boost by variably attenuating signals in the selected portion of the band.

3. A circuit arrangement as in claim 2 where the predetermined band comprises a range of bass audio frequencies.

4. A circuit arrangement as in claim 3 where the selected portion of the band comprises a lower end of said band.

5. A circuit arrangement as in claim 2 including a separating filter through which the variable band-pass filter is electrically coupled to the signal input and a signal combining means for eclectically coupling the differentiating circuit to the speaker;

said separating filter having an input electrically coupled to the signal input of the circuit arrangement, a first output electrically coupled to the first input of the variable band-pass filter for providing a first component of the variable amplitude input signal including the predetermined band of frequencies to said first input, and a second output for providing a second component of the variable amplitude input signal including a second band of frequencies; and said signal combining means having a first input electrically coupled to the output of the differentiating circuit, a second input electrically coupled to the second output of the separating filter, and an output for providing to the speaker a signal comprising a combination of a signal produced by the differentiating circuit and the second component of the variable amplitude input signal.

6. A speaker-driving circuit arrangement as in claim 1, 2, 3, 4 or 5 and at least one speaker electrically coupled to said arrangement.

* * * * *